(12) United States Patent
Analytis et al.

(10) Patent No.: US 12,230,308 B2
(45) Date of Patent: Feb. 18, 2025

(54) NON-LOCAL ANTIFERROMAGNETIC MEMORY STORAGE

(71) Applicant: THE REGENTS OF THE UNIVERSITY OF CALIFORNIA, Oakland, CA (US)

(72) Inventors: James G. Analytis, Berkeley, CA (US); Shannon C. Haley, Oakland, CA (US); Eran Maniv, Ramat Raziel (IL)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 279 days.

(21) Appl. No.: 18/054,318

(22) Filed: Nov. 10, 2022

(65) Prior Publication Data

US 2023/0147503 A1 May 11, 2023

Related U.S. Application Data

(60) Provisional application No. 63/277,720, filed on Nov. 10, 2021.

(51) Int. Cl.
*G11C 11/16* (2006.01)
*H10N 50/20* (2023.01)
*H10N 50/85* (2023.01)

(52) U.S. Cl.
CPC ........ *G11C 11/161* (2013.01); *G11C 11/1673* (2013.01); *G11C 11/1675* (2013.01); *H10N 50/20* (2023.02); *H10N 50/85* (2023.02)

(58) Field of Classification Search
CPC ............. G11C 11/161; G11C 11/1673; G11C 11/1675; H10N 50/20; H10N 50/85; H10N 50/10
See application file for complete search history.

(56) References Cited

U.S. PATENT DOCUMENTS 10,090,034 B2 * 10/2018 Belashchenko ........ H10N 50/85
10,644,228 B2 * 5/2020 Sasaki ................. G11C 11/1659
(Continued)

OTHER PUBLICATIONS

Haley, Shannon C. et al., "Long-range, Non-local Switching of Spin Textures in a Frustrated Antiferromagnet," arXiv, 2111.09882, vol. 1, Nov. 18, 2021, 14 pages.
(Continued)

*Primary Examiner* — Allison Bernstein
(74) *Attorney, Agent, or Firm* — O'BANION & RITCHEY LLP; John P. O'Banion

(57) ABSTRACT

Switchable antiferromagnetic (AFM) memory devices are provided based on an active material, $Fe_xNbS_2$, where $x>\frac{1}{3}$ and $Fe_xNbS_2$ where $x<\frac{1}{3}$, that exhibits the ability to manipulate spin information "non-locally" i.e. tens of microns away from the electrical stimulus. Spin information can be transported and stored non-locally in the $Fe_xNbS_2$ material. The devices leverage two long range effects: collective excitations to carry spin and strong magnetoelastic coupling to allow complex domain structures to propagate over large distances. The application of current pulses across the material can rotate or switch the AFM order between multiple directions. Non-local resistance measurements can detect the orientation of the AFM order as high or low resistance states. The state of the device can be set by input current pulses, and read-out by the resistance measurement, forming a non-volatile, AFM memory storage bit.

20 Claims, 11 Drawing Sheets

(56) References Cited

U.S. PATENT DOCUMENTS 10,804,459 B2 * 10/2020 Eom ............... H10N 50/10
11,342,500 B2    5/2022 Analytis

OTHER PUBLICATIONS

Wadley, P. et al., "Electrical switching of an antiferromagnet," Science, vol. 351, No. 6273, Jan. 14, 2016, pp. 587-590.

Nair, Nityan L. et al., "Electrical switching in a magnetically intercalated transition metal dichalcogenide," Nature Materials, vol. 19, Nov. 4, 2019, pp. 153-157.

Maniv, Eran et al., "Antiferromagnetic switching driven by the collective dynamics of a coexisting spin glass," Science Advances, vol. 7, No. 2, DOI: 10.1126/sciadv.abd8452, Jan. 8, 2021, 7 pages.

Wu, Shan et al., "Highly Tunable Magnetic Phases in Transition-Metal Dichalcogenide Fe1/3+δNbS2," Physical Review, X 12, 021003, Apr. 5, 2022, 19 pages.

Lebrun, R. et al., "Long-distance spin-transport across the Morin phase transition up to room temperature in ultra-low damping single crystals of theantiferromagnet α-Fe2O3," Nature Communications, vol. 11, Dec. 10, 2020, pp. 1-7.

Haley, Shannon C. et al., "Half-magnetization plateau and the origin of threefold symmetry breaking in an electrically switchable triangular antiferromagnet," Physical Review Research, vol. 2, Oct. 5, 2020, 14 pages.

Maniv, Eran et al., "Exchange bias due to coupling between coexisting antiferromagnetic and spin-glass orders," Nature Physics, vol. 17, Apr. 2021, pp. 525-531.

Little, Arielle et al.., "Three-state nematicity in the triangular lattice antiferromagnet Fe1/3NbS2," Nature Materials, vol. 19, May 18, 2020, pp. 1062-1067.

* cited by examiner

NON-LOCAL ANTIFERROMAGNETIC MEMORY STORAGE

CROSS-REFERENCE TO RELATED APPLICATIONS

This application claims priority to, and the benefit of, U.S. provisional patent application Ser. No. 63/277,720 filed on Nov. 10, 2021, incorporated herein by reference in its entirety.

STATEMENT REGARDING FEDERALLY SPONSORED RESEARCH OR DEVELOPMENT

This invention was made with government support under Contract No. DE-AC02-05CH11231 awarded by the U.S. Department of Energy. The government has certain rights in the invention.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

This technology pertains generally to antiferromagnetic materials and more particularly to devices and methods using non-local antiferromagnetic switching and memory storage. Spin-orbit interactions allow spin or angular momentum to be injected with electrical stimuli to manipulate the spin texture of the antiferromagnetic material, enabling the storage of information and energy.

2. Background

The semiconductor devices behind modern computers are rapidly approaching the physical limits of charge-based electronics, spurring research into novel materials that can enable 'spintronic' technologies that leverage the spin as well as the charge of an electron.

Conventional non-volatile data storage and spintronic sensing devices rely on ferromagnetic materials. However, ferromagnetic materials have the disadvantage of exhibiting ohmic losses during operation and unwanted interactions due to stray magnetic fields allowing information to be erased upon exposure to strong magnetic fields.

In contrast, antiferromagnetic materials (AFM) are generally insensitive to disturbing magnetic fields and do not produce stray magnetic fields. The field insensitivity of AFM materials, however, also creates difficulties in manipulating and detecting conditions complicating their use in high-density, ultrafast, extremely stable memory storage applications.

Spintronics are a class of devices that are based on the spin of an electron rather than its charge. Antiferromagnetic spintronics is an emerging area of quantum technologies that attempts to leverage the coupling between spin and orbital degrees of freedom in exotic materials. Electrical stimuli inject spin or angular momentum to manipulate the spin texture of a material, enabling the storage of information in the material.

In general, the physical process is intrinsically local in that spin is carried by an electrical current, imparted into the magnetic system, and the spin texture then rotates. The collective excitations of complex spin textures have rarely been utilized in this context, even though they can in principle transport spin over much longer distances, using much lower power.

Magnonics is an emerging subfield whereby the collective excitations of the magnetically ordered system, known as magnons, can be electrically stimulated. Such materials have unique advantages because the length scale over which spin is coherently transported without loss can be very large, in contrast to owing electrons whose spin decay is generally very short. In addition to spin coherence, there is also the challenge of spin-based memory.

Recently, it has been shown that some antiferromagnetic (AFM) materials can store spin information through the electrical manipulation of AFM domains. However, such technologies use spin polarized electrical currents that, on general grounds, are intrinsically local in nature. This is because the conduction electrons scatter spin and the transfer is constrained by the mean free path in the direction of the applied current. Coherent spin transport through collective excitations has therefore been limited to insulators and has not been extensively evaluated in metallic systems.

Accordingly, there is a need for new materials, devices and schemes to store spin information in complex magnetic systems where the spin information can be transported and stored non-locally in the active material.

BRIEF SUMMARY

Provided are antiferromagnetic (AFM) memory storage devices in which an electrical stimulus switches the direction of the AFM order between stable configurations from tens of microns away from the stimulus. This takes place in crystals which have been fabricated to support the application of brief, orthogonal DC current pulses in one portion of the device, and the measurement of resistance in a remote portion of the device. Crystals are grown with an appropriate amount of disorder and an additional coexisting magnetic order is introduced. The additional coexisting magnetic order is known as a spin glass and is believed to be integral to the long-distance transfer of information. Fabrication of devices is preferably performed using a high-precision focused ion beam approach and characterizing of the non-local switching behavior in the devices takes place along locations in a distal neck portion of the material.

This class of switchable, metallic antiferromagnets is illustrated with $Fe_xNbS_2$ is shown to exhibit the ability to manipulate spin information "non-locally" i.e. tens of microns away from the electrical stimulus. This is orders of magnitude further than the electron scattering length, or the magnon decay length of typical metallic antiferromagnets.

The devices leverage two long range effects: collective excitations to carry spin and strong magnetoelastic coupling to allow complex domain structures to propagate over large distances. In general, the physical process is intrinsically local: spin is carried by an electrical current, imparted into the magnetic system, and the spin texture then rotates. The collective excitations of complex spin textures utilized in this context to transport spin over much longer distances while using much lower power. Spin information can be transported and stored non-locally in the material $Fe_xNbS_2$. The collective modes leverage the strong magnetoelastic coupling in the system to achieve a novel way to store spin information in complex magnetic systems.

Fabricated devices centered on iron-intercalated niobium disulfide demonstrated non-local switching responses, which were comparable in magnitude to the local switching response in most cases.

Embodiments described herein allow for the transfer and storage of information in a novel way, transporting spin information via the collective excitations of an antiferromagnet and then storing that information by leveraging the interactions between antiferromagnetic domains. This result is surprising because these collective modes typically dissipate over distances about a thousand times smaller than the ones over which we see information being transported in the devices.

The device design, as shown in FIG. 1, includes crossed bars for electrical stimuli and at least one long leg or neck portion allowing non-local measurements. As used herein, a "local" response measurement is a measurement of the body of antiferromagnetic active material of the device and "non-local" measurements are distal from the center of the body taken along a radiating leg or neck portion attached to the body often tens of microns away from the electrical stimulus.

According to one aspect of the technology, antiferromagnetic switching devices are provided that may be incorporated into spintronic-based computer hardware as a method of transporting and storing information in antiferromagnetic bits. It could additionally be used as a non-local sensor.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWINGS

The technology described herein will be more fully understood by reference to the following drawings which are for illustrative purposes only.

DETAILED DESCRIPTION

Referring more specifically to the drawings, for illustrative purposes, systems and methods for electrical switching and transportation and non-local storage of spin information and switching platform and devices are generally shown. Several embodiments of the technology are described generally in FIG. 1 to FIG. 18 to illustrate the characteristics and functionality of the devices, systems, materials and methods. It will be appreciated that the methods may vary as to the specific steps and sequence and the systems and apparatus may vary as to structural details without departing from the basic concepts as disclosed herein. The method steps are merely exemplary of the order that these steps may occur. The steps may occur in any order that is desired, such that it still performs the goals of the claimed technology.

Figure 1:
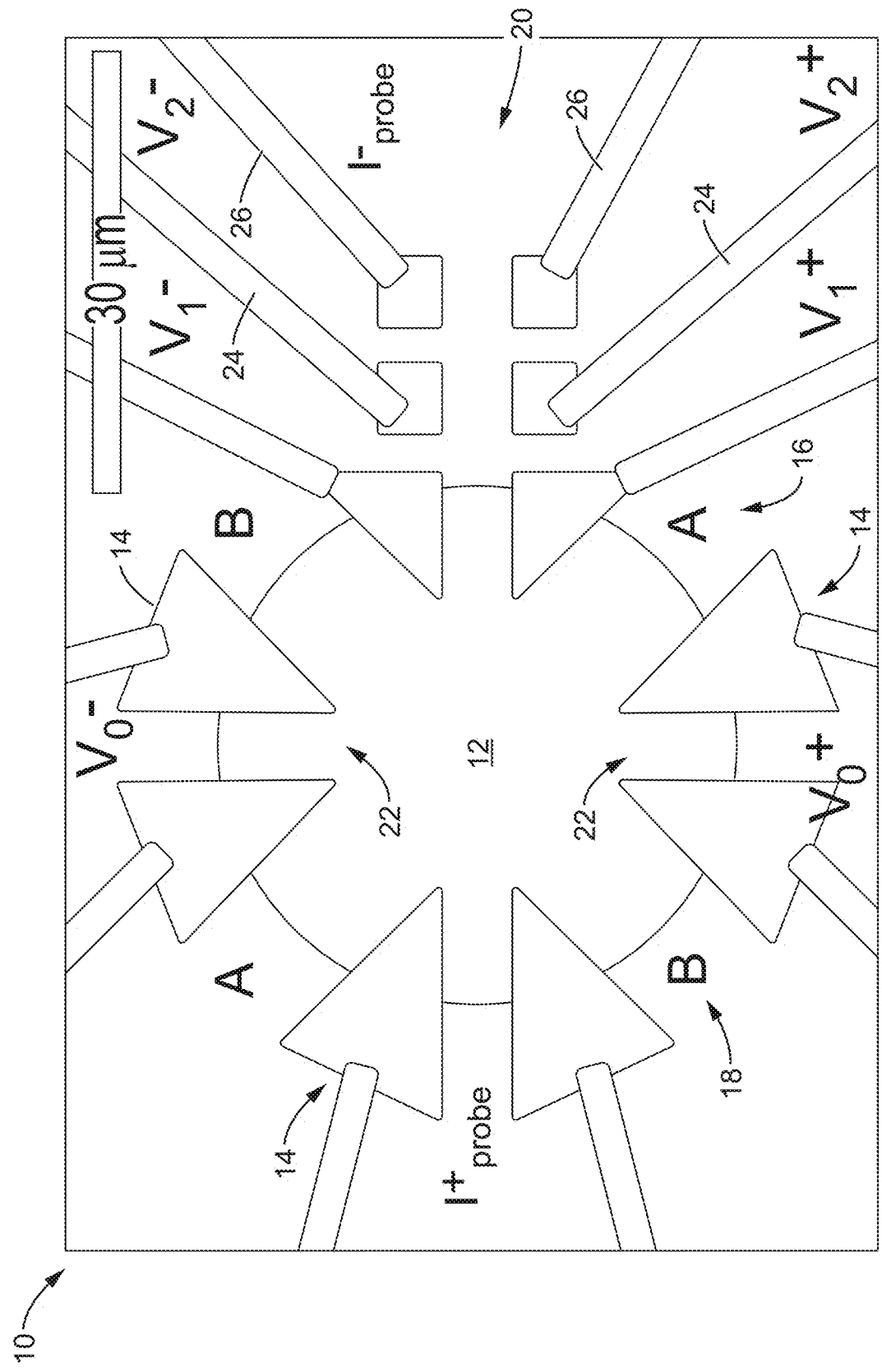
FIG. 1 is a schematic diagram of one switching device made from a bulk crystal with a radially extending neck according to one embodiment of the technology. The two pulse bars are marked A and B. The AC probe current is applied along the path marked $I_{probe}$. The local signal is measured using the contacts labeled $V_0$, and the non-local signals are measured using the pairs of contacts labeled $V_1$ and $V_2$.

Turning now to FIG. 1, the general structure 10 of one basic 8-terminal device configuration fabricated from single crystals of a class of a magnetically intercalated transition metal dichalcogenide $A_xMC_2$ materials is shown schematically. A crystal of an antiferromagnetic material 12 is microstructured as shown in FIG. 1. The switching device may be made from a bulk crystal that has at least one neck portion extending radially from the body of the material.

A $Fe_{1/3}NbS_2$ material is used to generally illustrate the methods and resulting device performance characteristics. Although electronically accessible, non-volatile, antiferromagnetic memory storage devices are demonstrated with $Fe_{1/3}NbS_2$ to illustrate the technology, other designs and compositions can be used as active materials to produce a variety of switchable antiferromagnetic memory storage devices.

In the simple embodiment shown in FIG. 1, the device has opposing pairs of terminals 14 that are triangular in shape and oriented to define two orthogonal pulse bars 16, 18 in the general shape of a cross. The two orthogonal pulse bars 16, 18 are marked A and B in FIG. 1. The AC probe current is applied along the path 20 that is marked $I_{probe}$. The local signal is measured using the contacts 22 labeled $V_0$, and the non-local signals are measured using the contacts 24, 26 that are labeled $V_1$ and $V_2$ in this embodiment.

The two linear bars "A" or "B" forming each pulse bar 16,18 of the cross may be used to apply orthogonal DC current pulses. The application of a sufficiently large DC current pulse along one pulse bar 16 of the device will rotate the AFM order to a fixed angle with respect to the current pulse through a spin transfer torque. Applying a DC pulse along the other pulse bar 18, will do the same with respect to that pulse, resulting in a rotation of the AFM order by approximately 90 degrees. Accordingly, the AFM order can be switched back and forth between two orthogonal orientations with the controlled application of DC pulses to each pulse bar.

The orientation of the AFM order can then be read out through a resistance measurement along one of the legs of the crossed bars. Generally, the resistance measurement will show a high or low value depending on the orientation of the AFM order due to the intrinsic anisotropic magnetoresistance (AMR) in the AFM materials.

The DC current pulse sets the direction of the AFM order that can then be read out as a high or low resistance state. Likewise, the state of the device can be set by the input DC current pulses, and read-out by the resistance measurement, forming a non-volatile, AFM memory storage bit.

In FIG. 1, the device is designed to measure the non-local switching response of the antiferromagnetic texture of $Fe_xNbS_2$ material 12. A brief DC current pulse between $10^4$ and $10^5$ A/cm² is applied between the contacts of pulse bar 16 marked A or the contacts of pulse bar 18 marked B. The DC current pulses are applied with a view to triggering magnons that can transport spin down the neck of the device. When this pulse is completed, the direction of the AFM order has been switched tens of microns away from where the current pulse was applied. The switched AFM order is observable via the transverse resistance as measured between the contacts marked "$V_1$" or the contacts marked "$V_2$," which will increase or decrease compared to the original state of the crystal following the application of these current pulses.

The transverse resistance is measured with an AC probe current (denoted with $I_{probe}$) at three distinct locations goes to either a higher or lower resistance state, depending on whether an A or B pulse has been administered. The contacts marked $V_0$, which intersect the current pulse bars are referred to as local, and the contacts marked $V_1$ and $V_2$ are referred to as non-local contacts.

The compound $Fe_xNbS_2$ is an easy-axis antiferromagnet on a triangular sublattice and a material 12 that has been found to switch between distinct resistance states upon the application of DC current pulses along perpendicular directions. Importantly, it appears that collective dynamics of the magnetic spin texture plays an important role with this directional switching, with very high tunability by compositional changes about x approximately equal to ⅓.

Recent work has shown that there are two nearly degenerate antiferromagnetic ground states in $Fe_xNbS_2$, one in which the spins form stripes and one in which they form zig-zags as illustrated schematically in FIG. 2 through FIG. 6. These orders compete, with the stripe order dominating at dilute compositions x<⅓, and zig-zag in the excess Fe composition x>⅓. The circles in these figures are iron atoms oriented in one plane. Lines drawn between iron atoms indicate that their spins are aligned.

Figure 2:
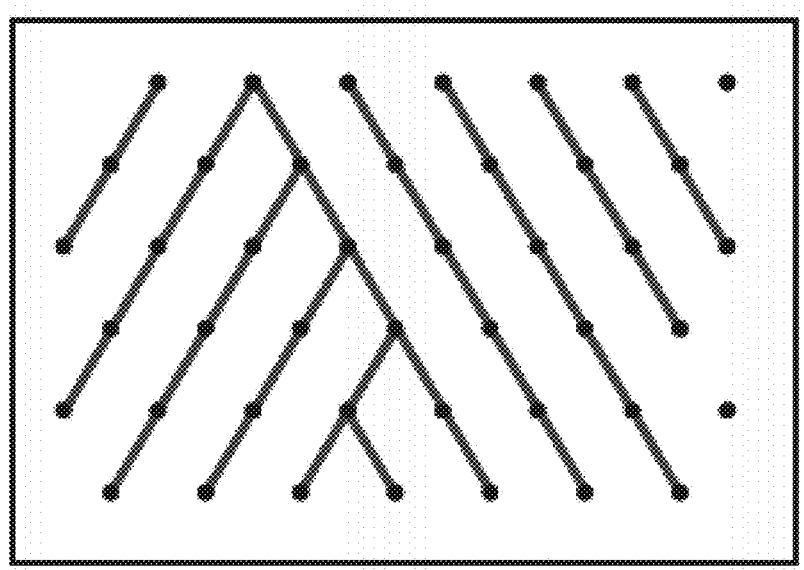
FIG. 2 is a schematic diagram illustrating stripe and zigzag domains. Circles are iron atoms in one plane. Lines drawn between iron atoms indicate their spins are aligned. Following a horizontal current pulse in a stripe-dominated sample, the domain with principal axis parallel to the current pulse is disfavored, resulting in a combination of the other two domain orientations.
Figure 3:
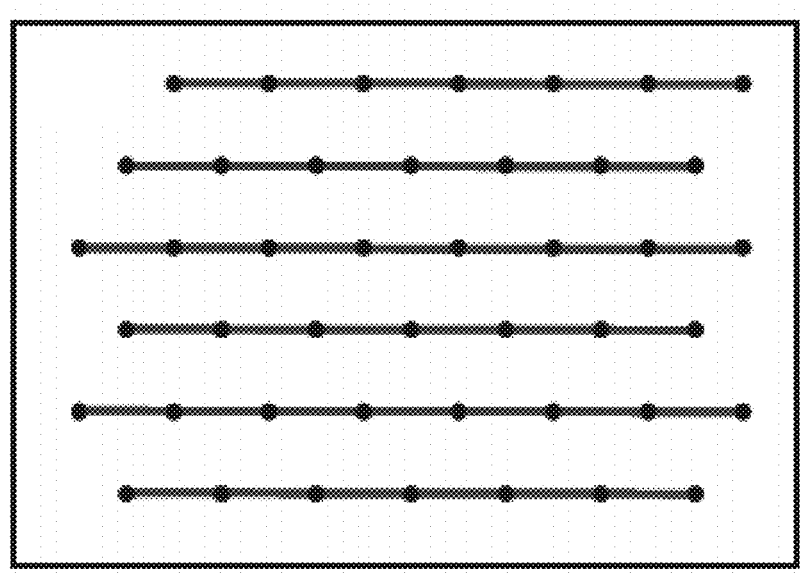
FIG. 3 is a schematic diagram of a stripe domain. Following a vertical current pulse, the domain with a principal axis that is perpendicular to the pulse is favored.

Domain structures for each different kind of magnetic order are shown schematically in FIG. 2 through FIG. 5. Following a horizontal current pulse in a stripe-dominated sample, for example, the domain with a principal axis parallel to the current pulse is disfavored, resulting in a combination of the other two domain orientations as illustrated in FIG. 2. Following a vertical current pulse, however, the domain with principal axis perpendicular to the pulse is favored as depicted in FIG. 3.

Figure 4:
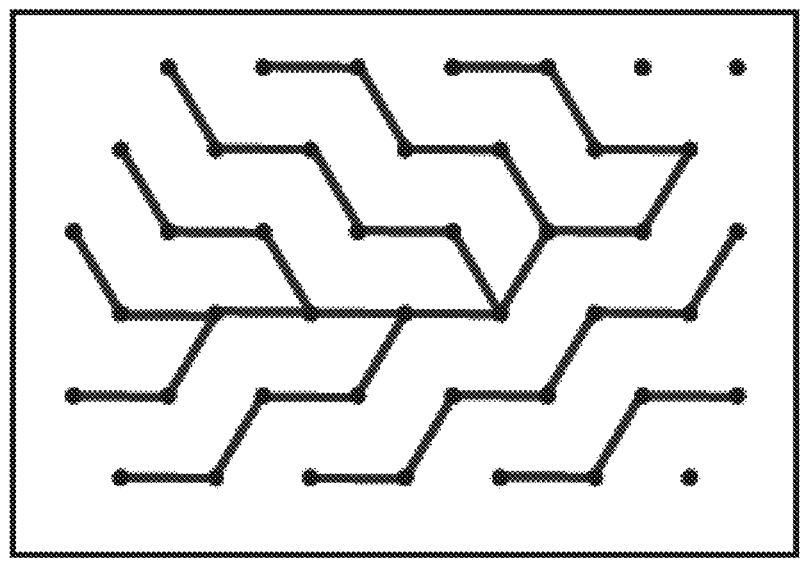
FIG. 4 is a schematic diagram of a zig-zag domain. Similarly, in zigzag-dominated samples, a horizontal current pulse favors domains whose principal axes are not parallel to the pulse.
Figure 5:
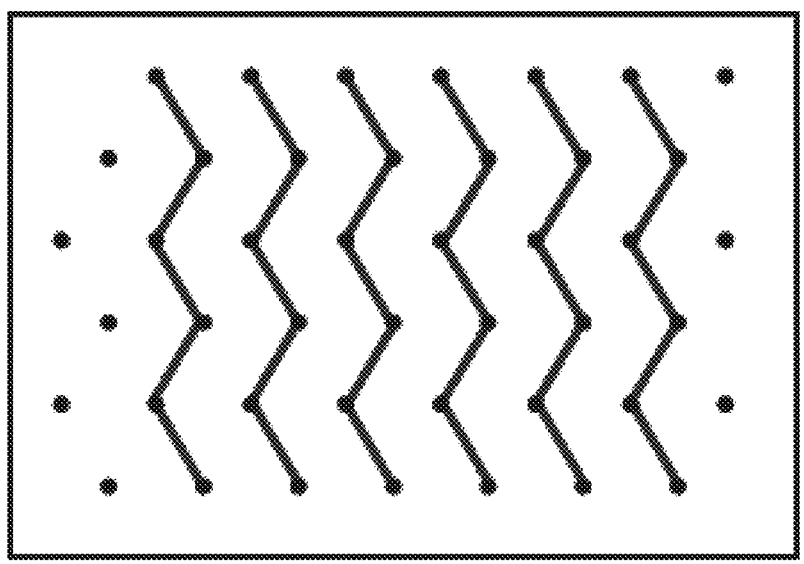
FIG. 5 is a schematic diagram of a vertically oriented zig-zag domain and a vertical current pulse favors the domain whose principal axis is perpendicular to the current pulse direction.
Figure 6:
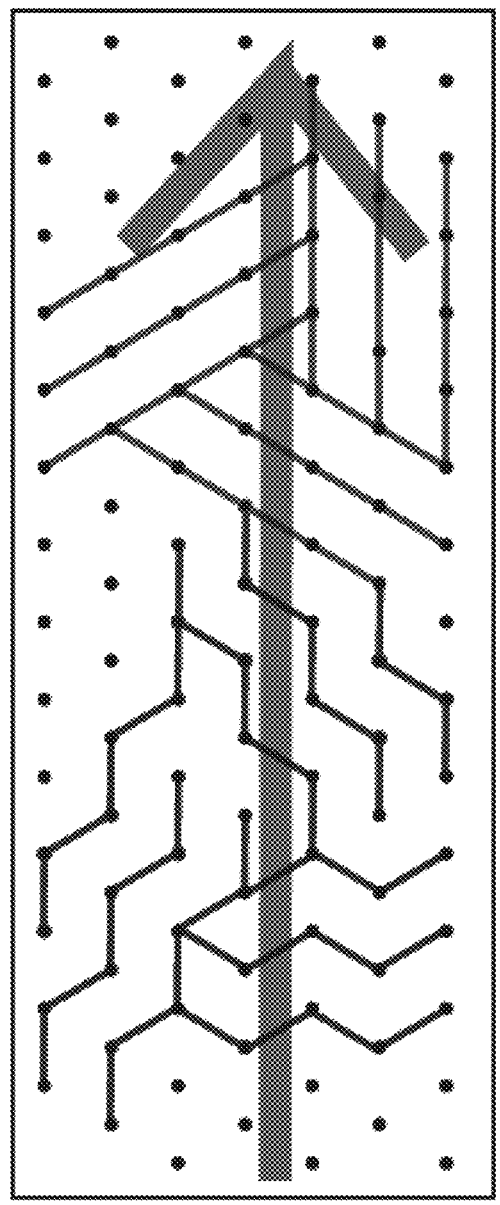
FIG. 6 is a schematic diagram of a panel where stripe and zig-zag orders coexist with opposite conductivity anisotropies so that there are competing switching responses.

Similarly, in zig-zag dominated samples, a horizontal current pulse favors domains whose principal axes are not parallel to the pulse as seen in FIG. 4, while a vertical current pulse favors the domain whose principal axis is perpendicular to the current pulse direction as shown in FIG. 5.

It can be seen that the domain configurations in the panels shown in FIG. 2 and in FIG. 4 have opposite conductivity anisotropies, as do those shown FIG. 3 and in FIG. 5. When stripe and zig-zag orders coexist, however, there will be competing switching responses, as shown schematically in FIG. 6 and FIG. 7.

Accordingly, a given direction of switching pulse j destabilizes domains whose principal axes are parallel to the applied current, so that a pulse in the [100] direction will strongly disfavor one specific stripy domain (e.g. FIG. 3) and one specific zig-zag domain (e.g. FIG. 5).

With respect to the principal axes, the conductivity tensor components $\sigma_{xx}>\sigma_{yy}$ for stripe domains and $\sigma_{xx}<\sigma_{yy}$ for zigzag domains, so when the current is applied along 45°, this leads to opposite switching responses in the off-diagonal conductivity. At compositions where the order parameters are comparable in magnitude, one would expect the response to vanish, which is exactly what is observed at x=⅓.

The complexities of the competing order parameters notwithstanding, the collective dynamics associated with the ordered phases or with the coexisting spin-glass phase will have collective modes that can carry spin currents. Typically, scattering off conduction electrons has limited the spin decay length to nanometers, and only in insulating antiferromagnets can this length be extended to microns.

However, such magnons can be used to also store information non-locally in the same antiferromagnet. It would mean that the elementary excitations of a magnetic texture rotate the magnetic texture itself. It has been shown that this unusual situation can be realized in a single material. By leveraging the intertwined order parameters of $Fe_xNbS_2$, spin information is not only carried far from the regions carrying the pulse current, but can also store information non-locally, tens of microns away from the active area.

The technology described herein may be better understood with reference to the accompanying examples, which are intended for purposes of illustration only and should not be construed as in any sense limiting the scope of the technology described herein as defined in the claims appended hereto.

Example 1

In order to demonstrate the functionality of the system and methods, one embodiment of the switching device was constructed and basic methods tested. Single crystals of $Fe_{1/3}NbS_2$ were grown via chemical vapor transport using iodine as the transport agent and then processed into a device. Specifically, a polycrystalline precursor was prepared from iron, niobium, and sulfur in the ratio x:1:2 (Fe:Nb:S). The resulting polycrystalline product was then placed in an evacuated quartz ampoule with iodine as a transport agent (2.2 mg/cm$^3$) and put in the hot end of a two zone MTI furnace with temperature set points of 800° C. and 950° C. for a period of 7 days. High quality hexagonal crystals with diameters up to several millimeters were obtained.

Devices were fabricated using the FEI Helios G4 Dual-Beam focused ion beam at the Molecular Foundry at Lawrence Berkeley National Laboratory. The devices were mounted on Torr Seal and sputtered with gold for electrical contact. In most cases the crystals were exfoliated to reach a thickness under 4 µm. The switching pulses were single square waves administered with Keithley 6221 Current Sources. The devices were fabricated with a circular body and radially extending neck and with contact and lead placement according to the design shown in FIG. 1.

Figure 8:
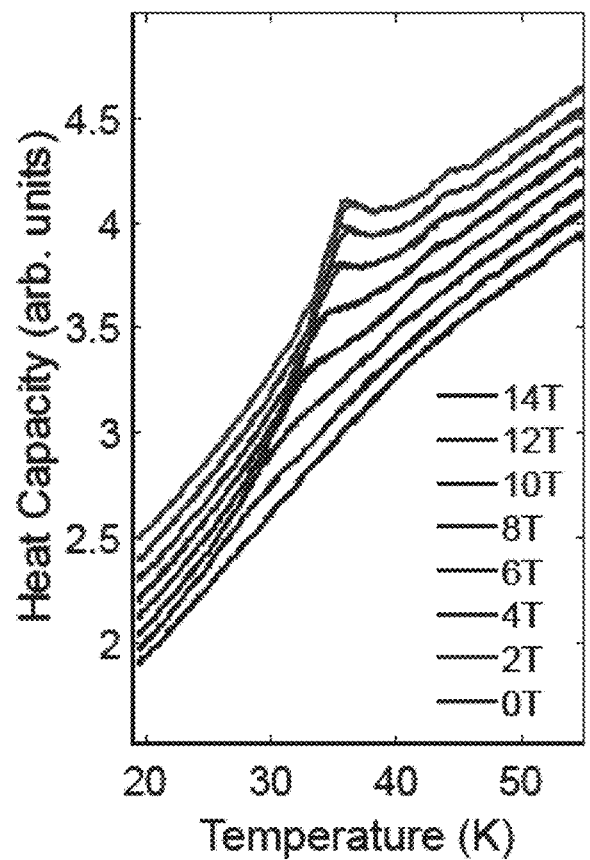
FIG. 8 is a plot of heat capacity as a function of temperature of the $Fe_xNbS_2$. Measurements under different magnetic fields are offset for visibility.

The heat capacity and magnetization as a function of temperature of the prepared antiferromagnetic material of the devices was evaluated. Heat capacity as a function of temperature of the material is shown in FIG. 8. Measurements under different magnetic fields are offset for visibility.

Figure 9:
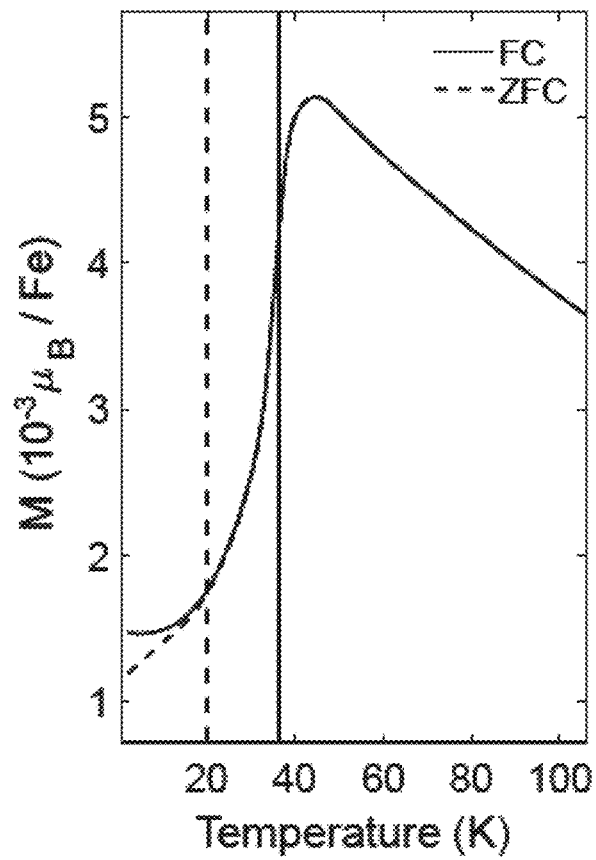
FIG. 9 is a plot of magnetization as a function of temperature measured in 1000 Oe along the c-axis. The field-cooled (FC) measurement, shown as a solid line, was measured from low to high temperature after cooling the sample in an 1000 Oe field. The zero-field-cooled (ZFC) measurement, shown as a dotted line, was measured from low to high temperature after cooling the sample with no external field.

The magnetization as a function of temperature measured in 1000 Oe along the c-axis is shown in FIG. 9. The field-cooled (FC) measurement, shown as a solid line, was measured from low to high temperature after cooling the sample in an 1000 Oe field. The zero-field-cooled (ZFC) measurement, shown as a dotted line, was measured from low to high temperature after cooling the sample with no external field.

The heat capacity and magnetization measurements of characteristic samples that are shown in FIG. 8 and FIG. 9 respectively, demonstrate magnetic transitions and spin glass behavior consistent with previous characterizations of $Fe_{1/3}NbS_2$ and $Fe_{0.35}NbS_2$.

Example 2

The transverse resistance switching response of the antiferromagnetic texture was tested with different compositions of $Fe_xNbS_2$ with x greater than or x less than $\frac{1}{3}$. Measurements presented in this Example were performed on samples in devices of the design shown in FIG. 1. The AC probe current was applied along the path marked $I_{probe}$. The local signal was measured using the contacts labeled $V_0$, and the non-local signals were measured using the contacts labeled $V_1$ and $V_2$.

Figure 10:
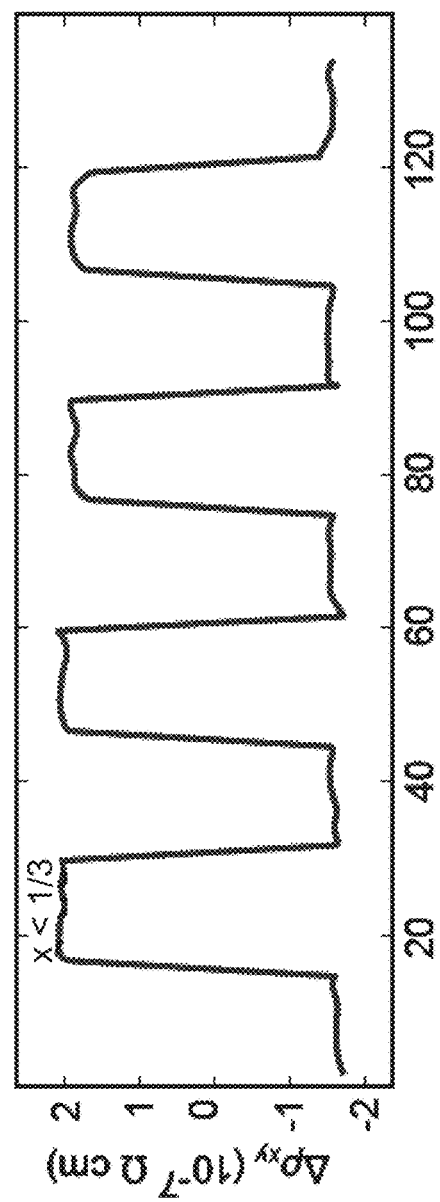
FIG. 10 is a plot of the transverse resistance switching response in $Fe_xNbS_2$ with $x<\frac{1}{3}$. Each jump in resistance is caused by a current pulse, and each fall by a perpendicular current pulse. Data were taken at 2K, with pulse current amplitudes of approximately $15\times10^4$ A/cm$^2$.

The transverse resistance switching response in $Fe_xNbS_2$ with x<$\frac{1}{3}$ is shown in FIG. 10. Each observed jump in resistance is caused by a current pulse, and each fall by a perpendicular current pulse. Data were taken at 2K, with pulse current amplitudes of approximately 15×10$^4$ A/cm$^2$, in the regime where switching has moved beyond the initial anomalous region as seen around 8.5×10$^4$ A/cm$^2$ in FIG. 12. In both cases, the first pulse and then every other subsequent pulse was normal to a crystal facet.

Figure 11:
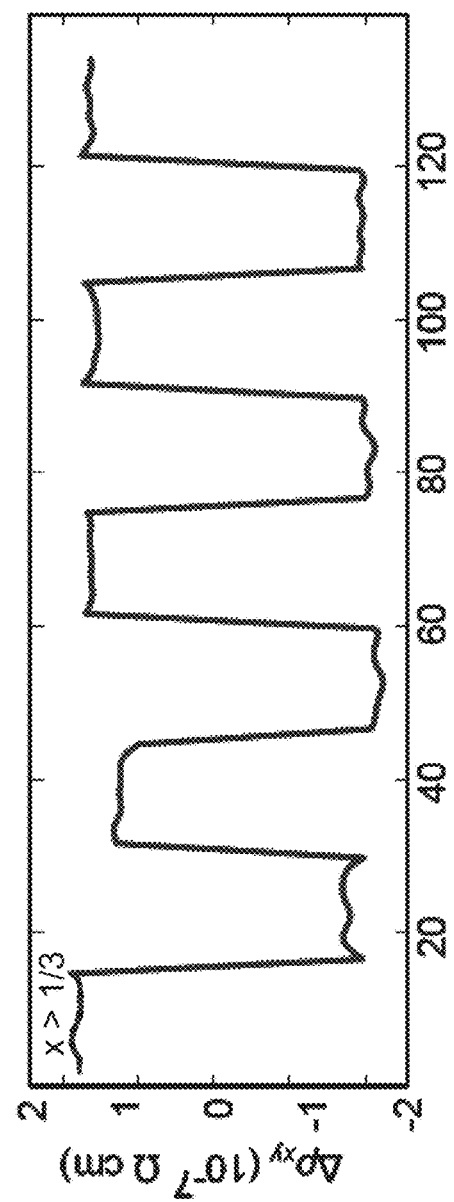
FIG. 11 is a plot of the transverse resistance switching response in $Fe_xNbS_2$ with $x>\frac{1}{3}$. With identical device geometries, a pulse which brought $x<\frac{1}{3}$ to a low resistance state brings $x>\frac{1}{3}$ to a high resistance state, and vice versa.

The transverse resistance switching response in $Fe_xNbS_2$ with x>$\frac{1}{3}$ is shown in FIG. 11. With identical device geometries, a pulse which brought x<$\frac{1}{3}$ to a low resistance state brings x>$\frac{1}{3}$ to a high resistance state, and vice versa. This demonstrated opposite switching responses in identical device geometries.

Example 3

Figure 12:
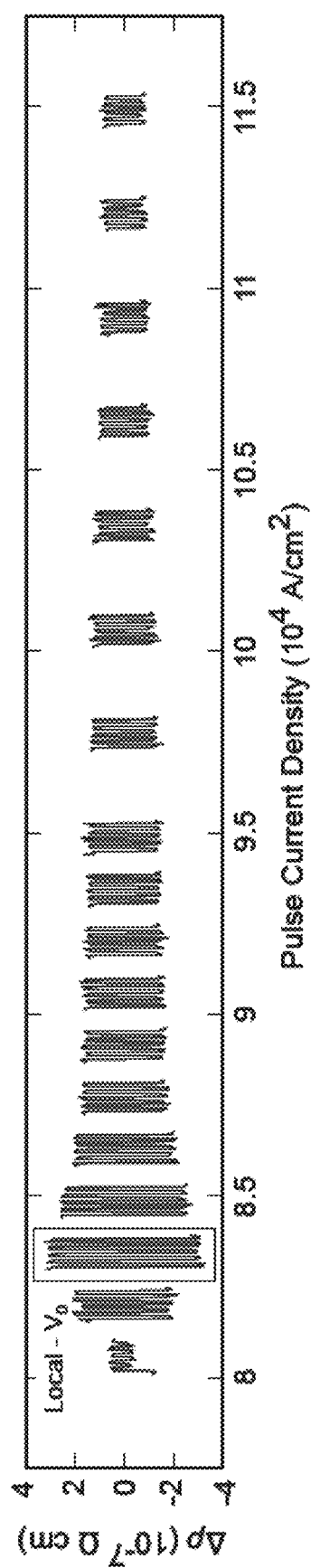
FIG. 12 is a plot of transverse resistance responses measured locally between the contacts labeled $V_0$ in FIG. 1.

To further evaluate the functionality of the devices, switching responses were evaluated at various pulse current densities and at contacts labeled $V_0$, $V_1$ or $V_2$. A plot of the local response as a function of pulse current density at this contact is shown in FIG. 12. The transverse resistance response measured locally between the contacts labeled $V_0$ is shown in FIG. 12 that plots the local response at this contact point as a function of pulse current density.

Figure 13:
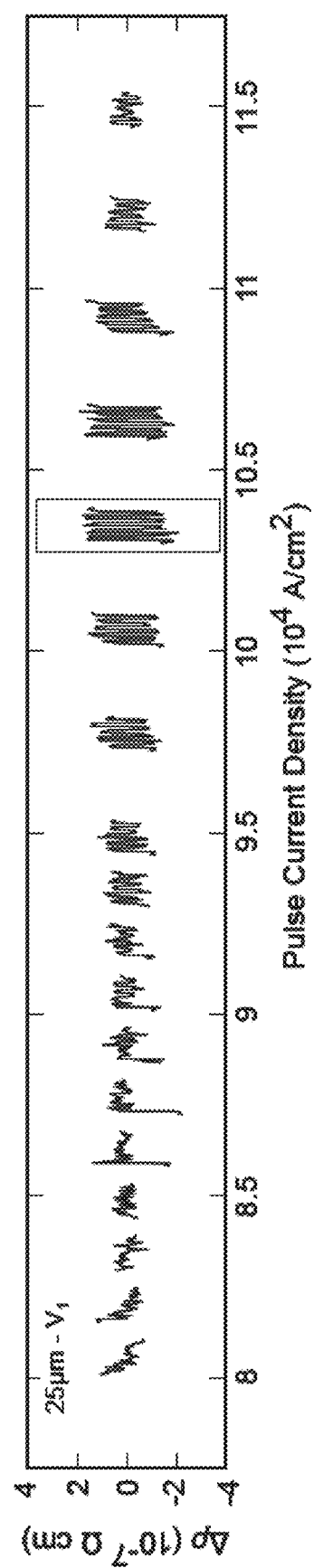
FIG. 13 is a plot of transverse resistance responses measured at 25 μm from the center of the device, between the contacts labeled $V_1$.

For comparison, the transverse resistance response measured at 25 µm from the center of the device, between the contacts labeled $V_1$ is shown in FIG. 13. The transverse resistance response measured 35 µm from the center of the device, between the contacts labeled $V_2$ is plotted in FIG. 14. Finally, the longitudinal resistance measured on the non-local portion of the device, between two adjacent contacts labeled $V_1$ and $V_2$, is shown in FIG. 15.

Referring again to the local response as a function of pulse current density plot of FIG. 12, it can be seen that the response is not monotonic, instead turning on at about 8×10$^4$ A/cm$^2$, quickly reaching a maximum, and then decreasing slightly to reach a stable level up to at least 11.4×10$^4$ A/cm$^2$. The nonmonotonic behavior seen here is possibly linked to the existence of two order parameters, the stripe and the zigzag phases, being affected at slightly different energies and their reorientation having opposite effects on the resistivity.

Figure 14:
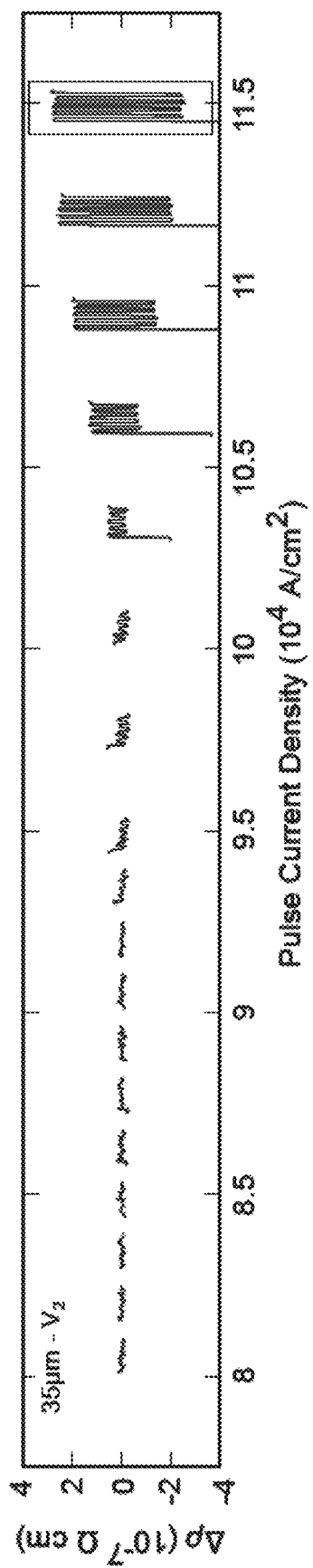
FIG. 14 is a plot of transverse resistance responses measured at 35 μm from the center of the device, between the contacts labeled $V_2$.
Figure 15:
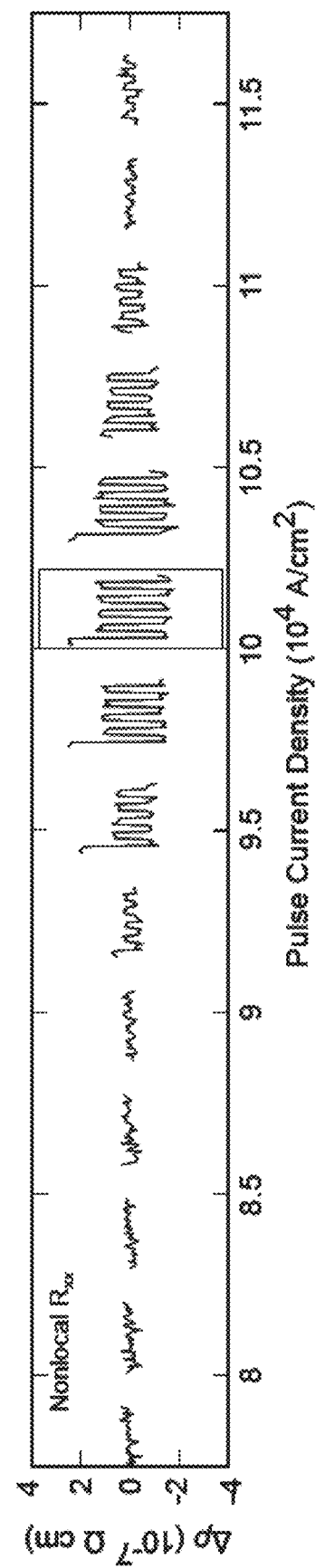
FIG. 15 is a plot of longitudinal resistance measured on the non-local portion of the device, between two adjacent contacts labeled $V_1$ and $V_2$.

The measurements taken at 25 µm (i.e. $V_1$) and 35 µm (i.e. $V_2$) from the center of the active portion of the device are shown in FIG. 13 and FIG. 14, respectively. The measurement taken 35 µm from the center required a larger current density to register a change from the pulses than was necessary at 25 µm from the center, and both require larger current densities than the local response ($V_0$). The relative sizes of the responses were observed to vary from device to device, but the current density required was largely unchanged.

Similar devices made of $Fe_xNbS_2$, x=$\frac{1}{3}$ showed weak local switching, but no stable switching response at the non-local contacts. The progressively larger current densities required to observe a switching response further from the active area of the device is largely consistent with the propagation of magnons, which dissipate with distance.

There are two notably surprising aspects to this result. First, the non-local contact which is closest to the edge of the crystal, while requiring a larger current density, tends to have a larger switching response than the non-local contact which is closer to the active area of the device. Second, the non-local contacts generally exhibit an opposite response to the non-local contacts, i.e. the same current pulse will raise the local transverse resistance and lower the non-local transverse resistance. This suggests that the domain structure in the non-local portion of the device is distinct from that in the local portion, perhaps with one current pulse effecting the order locally like that shown in FIG. 4 and the order non-locally like that shown in FIG. 5, or vice versa.

Example 4

Figure 16:
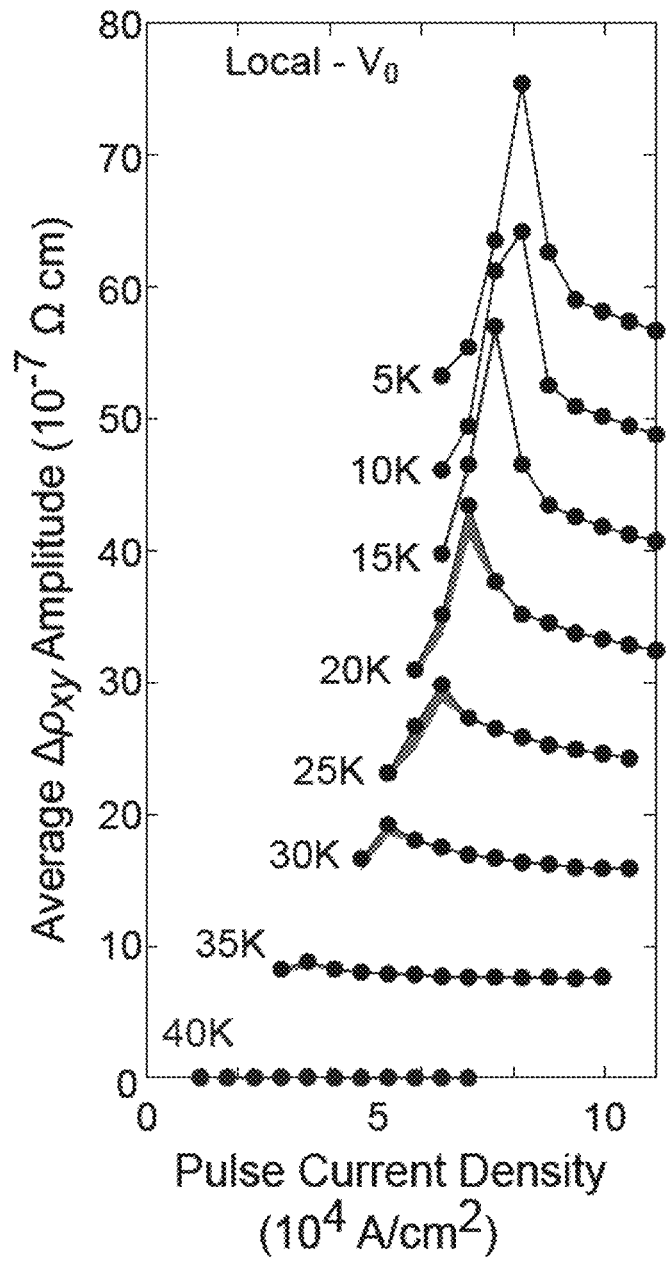
FIG. 16 is a plot of switching amplitudes observed locally ($V_0$) as a function of pulse current density. Data at different temperatures are offset for visibility. Switching amplitudes as observed immediately following the current pulse are shown as circles.
Figure 17:
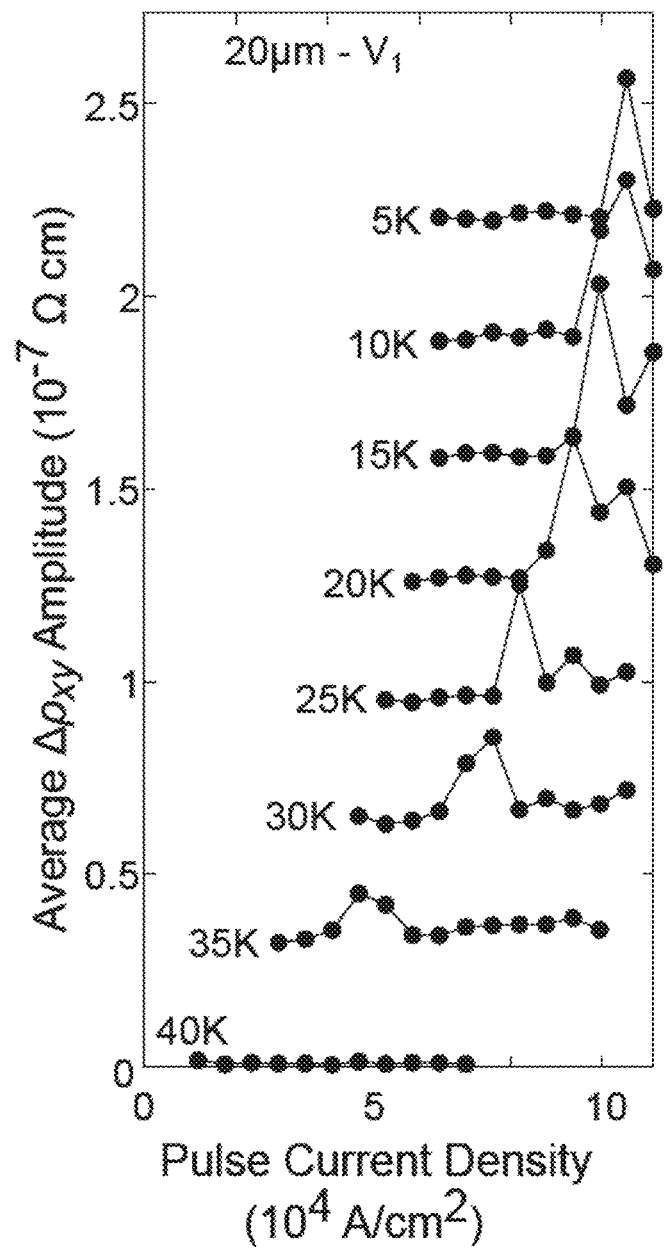
FIG. 17 is a plot of switching amplitudes observed at 20 μm from the center of the device at ($V_1$) as a function of pulse current density.
Figure 18:
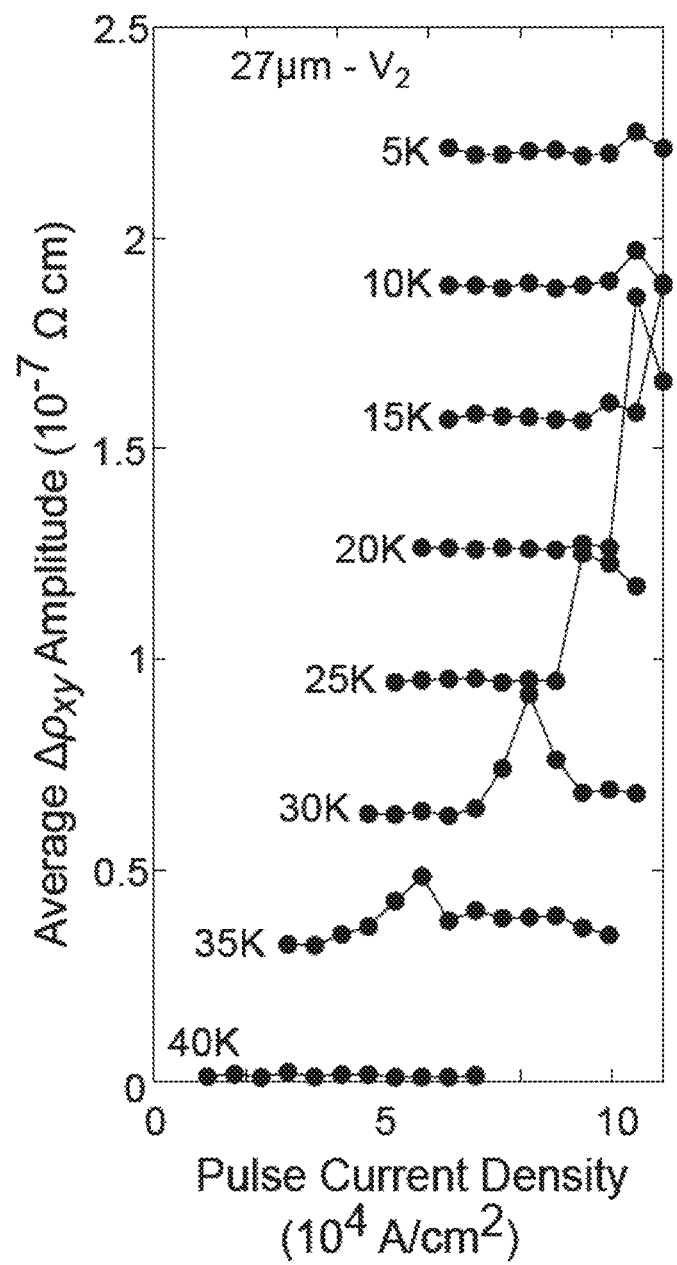
FIG. 18 is a plot of switching amplitudes observed at 27 μm from the center of the device at ($V_2$) as a function of pulse current density.

Switching amplitudes as a function of pulse current density at $V_0$, $V_1$ and $V_2$ at different temperatures were evaluated for devices structured like that of FIG. 1. The switching amplitudes that were observed at locations 0 μm, 20 μm and 27 μm from the center of the device, are shown in FIG. 16, FIG. 17 and FIG. 18, respectively. Switching amplitudes as observed immediately following the current pulse and observed tens of seconds after the pulse were compared and the comparison indicated the domains relax to some degree after the pulse at these temperatures.

In another device, the 27 μm contact was positioned 74 μm from the edge of the crystal body, more than twice as far as the 35 μm contact in the device producing the results shown in FIG. 14. The results were consistent with the overall trend of the nonlocal response being enhanced with decreased distance from the crystal's edge.

A comparison of the results plotted in FIG. 16, FIG. 17 and FIG. 18 illustrates the temperature dependence of the local and non-local $\sigma_{xy}$ responses to a range of pulse current densities. It was observed that all three locations ($V_0$, $V_1$ and $V_2$) on the device switched at lower current densities as the temperature increased. The threshold switching current grows with increasing temperature below the AFM temperature, as if following the AFM order parameter. Therefore, the disappearance of the switching response at the Neel temperature demonstrates a direct connection between the switching and the AFM order. Above 15K, the observed relaxation in between current pulses was increasingly apparent for the local contacts.

The response of $\sigma_{xx}$ between the 25 μm and 35 μm non-local contact is shown in FIG. 15. The non-local $R_{xx}$ response closely mimics the 25 μm non-local $R_{xy}$ response, with a peak just below $10.5 \times 10^4$ A/cm². The response of $\sigma_{xx}$ is notably absent where the 35 μm non-local $\sigma_{xy}$ response is strongest; this response suggests that the full conductivity tensor is affected in the 25 μm non-local region, whereas the 35 μm non-local region has a dominant response only in the off-diagonal components $\sigma_{xy}$. This could be explained by increased domain-wall scattering in the former, whereas the latter has fewer domains. In order to explain the opposite response between the local and 35 μm non-local switching, the average principal axis must be similarly oriented in the opposite direction.

Figure 7:
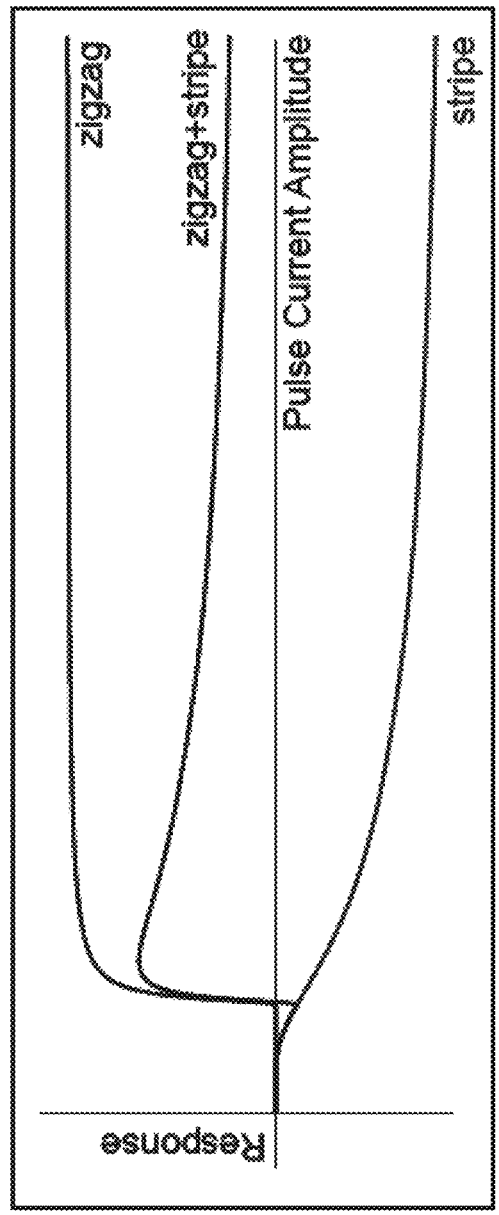
FIG. 7 is a plot of pulse current amplitudes of stripe, zig-zag and stripe and zig-zag switching responses showing competing anisotropies.

The temperature dependence of the switching amplitude shown in FIG. 16, FIG. 17 and FIG. 18 is strongly indicative that the threshold current required for the switching is proportional to the magnitude of two antiferromagnetic order parameters, each of which oppositely affects the conductivity tensor. The zig-zag and stripe order parameters onset at different current thresholds, just as they onset at different temperatures, as schematically shown in FIG. 7. This leads to the unusual peak structure in the switching response as a function of current density where the dominant order parameter rotates the conductivity tensor one way (the zig-zag since x>⅓), and then as the other grows it begins to rotate the conductivity tensor back (the sub-dominant stripy order). This same form was observed in the non-local contacts, suggesting the same kind of order parameter competition is also the cause of the switching observed in these regions. Collective excitations carry spin and rotate the spin texture in these non-local regions in the same way that the spin-polarized current pulses do in the local region.

Two unusual features from the data deserve some attention: (i) The non-local response closer to the active area has a consistently smaller signal than that closer to the crystal's edge; and (ii) The second non-local region has an average principal axis orientation that is always opposite to that of the local region. Both of these effects appear to be connected by the elastic energy of the system.

Additionally, recent work shows that the antiferromagnetic order is strongly coupled to a structural distortion. Similar to martensites, these magnetostrictive effects can prefer a multi-domain state due to the difference between the surface and bulk of the sample, though the energy penalty of creating a domain boundary must be overcome. For clamped samples, which are mechanically secured with TorrSeal epoxy resin, the incompatibility between the bulk strain induced by the AFM order and the surface strain acts as an "elastic charge" that produces a long-range field introducing a competing energy that can make multi-domain states favorable, similar to the long-range magnetic dipole effect in FMs.

Therefore, away from the local regions where spin is transferred due to the driving current, which will be smaller in size than the full sample, the system will tend to rotate in the opposite direction in order to preserve approximately equal total domain sizes of the different orientations. Since the clamped boundary is the originator of the long-range forces, it is natural to expect that this effect is most stark close to the crystal's edge, as seen in the 35 μm non-local $\sigma_{xy}$ response, while the region surrounding the closer non-local contacts would need to rearrange less. The 25 μm non-local response would then detect domain wall scattering and smaller re-orientations of the Neel vector, explaining its relatively smaller response in xy and larger response in $\sigma_{xx}$, just as observed.

This data unambiguously showed that the spin information imparted by the current pulses was carried tens of microns away from the current carrying region, implying an important role for spin-carrying collective excitations coupled to the magnetoelasticity of the system. These scales are orders of magnitude larger than spin decay lengths of typical metallic antiferromagnets, which is a welcome discovery relevant for potential technologies based on metallic antiferromagnets.

The observation of non-local switching due to collective antiferromagnetic dynamics should open a new pathway to magnonic memory and other spintronic applications of complex antiferromagnets.

From the description herein, it will be appreciated that the present disclosure encompasses multiple embodiments which include, but are not limited to, the following:

An electrically switchable antiferromagnetic device, the device comprising: (a) a device body with at least one neck extending radially from the body, the body formed from crystalline $Fe_xNbS_2$; (b) one or more write in electrodes mounted to the device body, the electrodes configured to be electrically coupled to a source of current; (c) one or more read out electrodes mounted to the neck of the device body, the read out electrode configured to measure a resistance state of the device body at the neck; (d) wherein an antiferromagnetic order of the device body rotates with the application of current to the write in electrode from the current source.

The device of any preceding or following implementation, wherein the crystalline $Fe_xNbS_2$ is selected from the group of $Fe_xNbS_2$ where $x>\frac{1}{3}$ and $Fe_xNbS_2$ where $x<\frac{1}{3}$.

The device of any preceding or following implementation, further comprising: a second read out electrode, the electrode configured to measure resistance at a center of the device body; wherein a non-local resistance signal is measured by the read out electrode at the neck and a local resistance signal is measured with the second read out electrode.

The device of any preceding or following implementation, wherein the one or more read out electrodes mounted to the neck of the device body comprise: a first read out electrode at a first distance from a center of the device body; and a second read out electrode at a second distance the center of the device body; wherein a non-local resistance signal is measured by the first and second read out electrodes at different locations on the neck.

The device of any preceding or following implementation, further comprising: a third read out electrode, the third electrode configured to measure resistance at a center of the device body; wherein a non-local resistance signal is measured by the first and second read out electrodes at the neck and a local resistance signal is measured with the third read out electrode.

The device of any preceding or following implementation, wherein the write in electrodes are oriented on the device body to form a first pulse bar across the device body and a second pulse bar orthogonal to the first pulse bar, the first and second pulse bars intersecting at the center of the device body.

The device of any preceding or following implementation, further comprising: a body read out electrode, the body electrode configured to measure resistance at the center of the device body at the intersection of the first and second pulse bars.

An electrically switchable antiferromagnetic device, the device comprising: (a) a device body with at least one neck extending radially from the body, the body formed from crystalline $Fe_xNbS_2$; (b) one or more electrodes mounted to the device body, the electrodes configured to be electrically coupled to a source of current; (c) a first read out electrode at a first distance from a center of the device body configured to measure a resistance state of the device body at the neck; and (d) a second read out electrode at a second distance the center of the device body; (e) wherein an antiferromagnetic order of the device body rotates with the application of current to the write in electrode from the current source; and (f) wherein a non-local resistance signal is measured by the first and second read out electrodes at different locations on the neck.

The device of any preceding or following implementation, wherein the crystalline $Fe_xNbS_2$ is selected from the group of $Fe_xNbS_2$ where $x>\frac{1}{3}$ and $Fe_xNbS_2$ where $x<\frac{1}{3}$.

The device of any preceding or following implementation, further comprising: a third read out electrode, the third electrode configured to measure resistance at a center of the device body; wherein a non-local resistance signal is measured by the first and second read out electrodes at the neck and a local resistance signal is measured with the third read out electrode.

The device of any preceding or following implementation, wherein the write in electrodes are oriented on the device body to form a first pulse bar across the device body and a second pulse bar orthogonal to the first pulse bar, the first and second pulse bars intersecting at the center of the device body.

A method of manipulating antiferromagnetic ordering in an antiferromagnetic material, the method comprising: (a) forming an active element with a body and a neck extending radially from the body, the active element formed from a single crystal of $Fe_xNbS_2$; (b) forming a plurality of write-in electrodes on the body of the active element, the electrodes electrically coupled to a source of current; (c) forming a plurality of read-out electrodes on the neck of the active element, the electrodes; (d) applying a current pulse to one write-in electrode; and (e) measuring a resistance of at least one read-out electrode to determine a resistance state.

The method of any preceding or following implementation, wherein the $Fe_xNbS_2$ is selected from the group of $Fe_xNbS_2$ where $x>\frac{1}{3}$ and $Fe_xNbS_2$ where $x<\frac{1}{3}$.

The method of any preceding or following implementation, further comprising: applying a second current pulse to an electrode in an orthogonal orientation to the first current pulse electrode; measuring a resistance of at least one read-out electrode; and assigning a resistance state from the measured resistance after the second current pulse.

The method of any preceding or following implementation, further comprising: forming a body read out electrode, the body electrode configured to measure resistance at a center of the active element body; measuring a non-local resistance signal with at least one read out electrode at the neck; and measuring a local resistance signal with the body read out electrode.

The method of any preceding or following implementation, wherein the forming one or more read out electrodes comprises: forming a first read out electrode at a first distance from a center of the active element body; and forming a second read out electrode at a second distance the center of the active element body; and measuring a non-local resistance signal with the first and second read out electrodes at different locations on the neck.

The method of any preceding or following implementation, further comprising: a third read out electrode, the third electrode configured to measure resistance at a center of the device body; wherein a non-local resistance signal is measured by the first and second read out electrodes at the neck and a local resistance signal is measured with the third read out electrode.

The method of any preceding or following implementation, further comprising controlling a temperature of the active element.

The method of any preceding or following implementation, further comprising controlling a pulse current density across the active element.

The method of any preceding or following implementation, further comprising setting an initial AMF order state with at least one input current pulse.

As used herein, term "implementation" is intended to include, without limitation, embodiments, examples, or other forms of practicing the technology described herein.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present disclosure describe where either A, B, or C can be present, or any combination of items A, B and C. Phrasing constructs indicating, such as "at least one of" followed by listing a group of elements, indicates that at least one of these group elements is present, which includes any possible combination of the listed elements as applicable.

References in this disclosure referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system or method.

As used herein, the term "set" refers to a collection of one or more objects. Thus, for example, a set of objects can include a single object or multiple objects.

Relational terms such as first and second, top and bottom, and the like may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element.

As used herein, the terms "approximately", "approximate", "substantially", "essentially", and "about", or any other version thereof, are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

The term "coupled" as used herein is defined as connected, although not necessarily directly and not necessarily mechanically. A device or structure that is "configured" in a certain way is configured in at least that way, but may also be configured in ways that are not listed.

Benefits, advantages, solutions to problems, and any element(s) that may cause any benefit, advantage, or solution to occur or become more pronounced are not to be construed as a critical, required, or essential features or elements of the technology describes herein or any or all the claims.

In addition, in the foregoing disclosure various features may grouped together in various embodiments for the purpose of streamlining the disclosure. This method of disclosure is not to be interpreted as reflecting an intention that the claimed embodiments require more features than are expressly recited in each claim. Inventive subject matter can lie in less than all features of a single disclosed embodiment.

The abstract of the disclosure is provided to allow the reader to quickly ascertain the nature of the technical disclosure. It is submitted with the understanding that it will not be used to interpret or limit the scope or meaning of the claims.

It will be appreciated that the practice of some jurisdictions may require deletion of one or more portions of the disclosure after that application is filed. Accordingly the reader should consult the application as filed for the original content of the disclosure. Any deletion of content of the disclosure should not be construed as a disclaimer, forfeiture or dedication to the public of any subject matter of the application as originally filed.

The following claims are hereby incorporated into the disclosure, with each claim standing on its own as a separately claimed subject matter.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An electrically switchable antiferromagnetic device, the device comprising: (a) a device body with at least one neck extending radially from the device body, said device body formed from crystalline $Fe_xNbS_2$; (b) one or more write in electrodes mounted to said device body, said write in electrodes configured to be electrically coupled to a source of current; and (c) one or more read out electrodes mounted to said neck of said device body, said read out electrode configured to measure a resistance state of said device body at said neck; (d) wherein an antiferromagnetic order of said device body rotates with the application of current to said write in electrode from said current source.

2. The device of claim 1, wherein the crystalline $Fe_xNbS_2$ is selected from the group of $Fe_xNbS_2$ where $x>1/3$ and $Fe_xNbS_2$ where $x<1/3$.

3. The device of claim 1, further comprising: a second read out electrode, said second read out electrode configured to measure resistance at a center of the device body; wherein a non-local resistance signal is measured by the read out electrode at the neck and a local resistance signal is measured with the second read out electrode.

4. The device of claim 1, wherein said one or more read out electrodes mounted to said neck of said device body comprise: a first read out electrode at a first distance from a center of the device body; and a second read out electrode at a second distance from the center of the device body; wherein a non-local resistance signal is measured by the first and second read out electrodes at different locations on the neck.

5. The device of claim 4, further comprising: a third read out electrode, said third read out electrode configured to measure resistance at a center of the device body; wherein a non-local resistance signal is measured by the first and second read out electrodes at the neck and a local resistance signal is measured with the third read out electrode.

6. The device of claim 1, wherein said write in electrodes are oriented on said device body to form a first pulse bar across the device body and a second pulse bar orthogonal to the first pulse bar, said first and second pulse bars intersecting at the center of the device body.

7. The device of claim 6, further comprising: a body read out electrode, said body read out electrode configured to measure resistance at the center of the device body at the intersection of said first and second pulse bars.

8. An electrically switchable antiferromagnetic device, the device comprising: (a) a device body with at least one neck extending radially from the device body, said device body formed from crystalline $Fe_xNbS_2$; (b) one or more write in electrodes mounted to said device body, said write in electrodes configured to be electrically coupled to a source of current; (c) a first read out electrode at a first distance from a center of the device body configured to measure a resistance state of said device body at said neck; and (d) a second read out electrode at a second distance from the center of the device body; (e) wherein an antiferromagnetic order of said device body rotates with the application of current to said write in electrode from said current source; and (f) wherein a non-local resistance signal is measured by the first and second read out electrodes at different locations on the neck.

9. The device of claim 8, wherein the crystalline $Fe_xNbS_2$ is selected from the group of $Fe_xNbS_2$ where $x>1/3$ and $Fe_xNbS_2$ where $x<1/3$.

10. The device of claim 8, further comprising: a third read out electrode, said third read out electrode configured to measure resistance at a center of the device body; wherein a non-local resistance signal is measured by the first and second read out electrodes at the neck and a local resistance signal is measured with the third read out electrode.

11. The device of claim 8, wherein said write in electrodes are oriented on said device body to form a first pulse bar across the device body and a second pulse bar orthogonal to the first pulse bar, said first and second pulse bars intersecting at the center of the device body.

12. A method of manipulating antiferromagnetic ordering in an antiferromagnetic material, the method comprising: (a) forming an active element with a body and a neck extending radially from the body, said active element formed from a single crystal of $Fe_xNbS_2$; (b) forming a plurality of write-in electrodes on said body of the active element, said write in electrodes electrically coupled to a source of current; (c) forming a plurality of read-out electrodes on said neck of said active element, said read out electrodes; (d) applying a current pulse to one write-in electrode; and (e) measuring a resistance of at least one read-out electrode to determine a resistance state.

13. The method of claim 12, wherein the $Fe_xNbS_2$ is selected from the group of $Fe_xNbS_2$ where $x>1/3$ and $Fe_xNbS_2$ where $x<1/3$.

14. The method of claim 12, further comprising: applying a second current pulse to a write in electrode in an orthogonal orientation to the first current pulse; measuring a resistance of at least one read-out electrode; and assigning a resistance state from the measured resistance after the second current pulse.

15. The method of claim 12, further comprising: forming a body read out electrode, said body read out electrode configured to measure resistance at a center of the active element body; measuring a non-local resistance signal with at least one read out electrode at the neck; and measuring a local resistance signal with the body read out electrode.

16. The method of claim 12, wherein said forming one or more read out electrodes comprises: forming a first read out electrode at a first distance from a center of the active element body; and forming a second read out electrode at a second distance from the center of the active element body; and measuring a non-local resistance signal with the first and second read out electrodes at different locations on the neck.

17. The method of claim 16, further comprising: a third read out electrode, said third read out electrode configured to measure resistance at a center of the body; wherein a non-local resistance signal is measured by the first and second read out electrodes at the neck and a local resistance signal is measured with the third read out electrode.

18. The method of claim 12, further comprising controlling a temperature of the active element.

19. The method of claim 12, further comprising controlling a pulse current density across the active element.

20. The method of claim 12, further comprising setting an initial AMF order state with at least one input current pulse.

* * * * *